United States Patent [19]

Fasang et al.

[11] Patent Number: 4,922,492

[45] Date of Patent: May 1, 1990

[54] ARCHITECTURE AND DEVICE FOR TESTABLE MIXED ANALOG AND DIGITAL VLSI CIRCUITS

[75] Inventors: Patrick P. Fasang, Saratoga; Daryl E. Mullins, Pleasanton, both of Calif.

[73] Assignee: National Semiconductor Corp., Santa Clara, Calif.

[21] Appl. No.: 193,623

[22] Filed: May 13, 1988

[51] Int. Cl.⁵ ............................................ G01R 31/28
[52] U.S. Cl. .................... 371/22.1; 371/22.6
[58] Field of Search ..................... 371/15, 20, 25, 22.1, 371/22.6; 324/73 R, 73 AT, 73 PC; 364/579, 580

[56] References Cited

U.S. PATENT DOCUMENTS

| | | | |
|---|---|---|---|
| 4,168,527 | 9/1979 | Winkler | 364/580 |
| 4,439,858 | 3/1984 | Petersen | 371/20 |
| 4,441,183 | 4/1984 | Dussault | 371/25 |
| 4,517,512 | 5/1985 | Petrich et al. | 324/73 R |
| 4,555,783 | 11/1985 | Swanson | 371/15 |
| 4,583,223 | 4/1986 | Inoue et al. | 371/20 |
| 4,602,210 | 7/1986 | Fasang et al. | 324/73 R |
| 4,709,366 | 11/1987 | Scott et al. | 371/20 |
| 4,802,163 | 1/1989 | Hirabayashi | 371/15 |
| 4,816,750 | 3/1989 | Vander Kloot et al. | 324/73 R |

OTHER PUBLICATIONS

Miczo, Digital Logic Testing and Simulation, Harper and Row, New York, 1986, pp. 228-253.
E. B. Eichelberger and T. W. Williams, "A Logic Design Structure For LSI Testability," DAC Proceedings, 1977, pp. 206-212.
H. Ando, "Testing VLSI With Random Access Scan," Compcon Spring Proceedings, 1980, pp. 243-245.

Primary Examiner—Charles E. Atkinson
Attorney, Agent, or Firm—Townsend and Townsend

[57] ABSTRACT

An architecture and device for testing mixed analog and digital VLSI circuits, wherein the digital circuit portions of the chip are grouped into a digital block, and the analog circuit protions of the chip are grouped into an analog block. Analog signals are provided to the digital block through an A/D transducer, and digital signals are provided to the analog block through a D/A transducer. The analog and digital blocks may be isolated from each other by a digital input multiplexer disposed between the A/D transducer and the digital block, and by an analog input multiplexer disposed between the D/A transducer and the analog block. To minimize the number of pins required to implement the architecture, multiplexers are connected to accessed circuit nodes in the analog block and the digital block for selectively communicating signals from the accessed nodes to external output pins.

23 Claims, 2 Drawing Sheets

ARCHITECTURE AND DEVICE FOR TESTABLE MIXED ANALOG AND DIGITAL VLSI CIRCUITS

BACKGROUND OF THE INVENTION

1. Field Of The Invention

This invention relates to integrated circuits and, more particularly to an architecture and device for testing mixed analog and digital VLSI circuits.

2. Description Of The Related Art

The advent of Application Specific Integrated Circuit (ASIC) chips has enabled system designers to put an entire printed circuit board, and increasingly more electronic circuitry, into one chip. This type of customization began with digital circuits only. Today, however, analog circuits also are offered by ASIC vendors as part of their ASIC libraries. This move to combine analog and digital technology reflects the pressure to integrate electronic functions into real-world applications, such as automobiles, telephones, and other consumer products which typically are analog-based. Previously, such applications were handled by discrete analog circuits which received signals from sensors and then communicated an output signal to separate digital circuitry through analog/digital converters for further processing.

For digital circuitry to interface effectively with analog circuitry in present-day applications, the digital and analog circuits must be merged on a single silicon chip. However, combining analog and digital circuitry on a single silicon chip raises unique problems, especially when the circuits are to be tested. For example, the testing philosophies of analog and digital circuits are entirely different. Analog circuits produce continuous signals having various magnitudes, and they are tested not only by sensing the existence of a signal, but its magnitude, as well. On the other hand, digital circuits produce signals which are binary, and they are tested by testing the binary response of a circuit when a given combination of binary signals are applied to the inputs of the circuit. With digital circuits, the exact magnitude of each signal is relatively unimportant, as long as it is within a given set of lower and upper limits. Nonetheless, both testing philosophies must be accommodated when digital and analog circuits are combined on one chip.

Testing is further complicated by the fact that gate-to-pin ratios increase as technology advances. Since it is not feasible or practical to bring all of the circuit nodes which should be tested out to the package pins, problems of controllability and observability arise. "Controllability" in this context refers to the ability to apply a test stimulus to a circuit node. "Observability" refers to the ability to observe the circuit's response to a test condition. Since some outputs may not change states in response to a test stimulus, it is desirable to access some intermediate node in the circuit which indicates some kind of response when a test input signal is applied. If this is not possible, the chips may be untestable or, at least, are very difficult to test.

The use of analog circuitry in the chip also raises issues of completeness in testing. Since analog signals are continuous and are typically tested by sensing a signal level within the circuit, an analog circuit may have innumerable parameters to be tested. Testing of all parameters either is not possible or is excessive in terms of additional pin requirements and testing time. Consequently, certain parameters, of necessity, are not tested.

Another problem with testing mixed analog/digital circuitry arises from circuit interactions. For example, an operational amplifier (op amp) is an unconnected circuit with no feedback or gainsetting (feedforward) resistors when purchased as a standard product. In an ASIC chip, however, an op amp is not an unconnected circuit. It is surrounded by feedback and gainsetting resistors, or switches and capacitors, thus complicating the testing of certain parameters. Testing of the analog circuit also may be interfered with by switching transients caused by digital signals. These switching transients induce interference in the analog circuit.

Because of the foregoing considerations, testing methods frequently are implemented in an ad hoc fashion by specialists. Consequently, the testing techniques employed cannot be followed by non-specialists, cannot be automated, may not provide good testability, and do not lend themselves to fault-grading.

SUMMARY OF THE INVENTION

The present invention is directed to an architecture and device for designing testable mixed analog and digital VLSI circuits. The architecture and device according to the present invention provide controllability and observability of test conditions by allowing separate testing and fault isolation of the analog and digital circuits within the chip. At the same time, the number of additional package pins required for testing is kept to a minimum.

In one embodiment of the present invention, the digital circuit portions of the chip are grouped into a digital block, and the analog circuit portions of the chip are grouped into an analog block. The analog block includes an analog input terminal for receiving digital information from the digital block, a first 5 analog output terminal for providing analog information to the digital block, and a second analog output terminal for providing an output signal from the analog block. Likewise, the digital block includes a digital input terminal for receiving analog information from the analog circuit, a first digital output terminal for providing digital information to the analog block, and a second digital output terminal for providing an output signal from the digital block.

A first analog multiplexer is coupled to the analog input terminal, to the first digital output terminal, and to an analog test-input line for selectively communicating signals from one of the first digital output terminal or analog test-input line to the analog input terminal. Similarly, a first digital multiplexer is coupled to the digital input terminal, to the first analog output terminal, and to a digital test-input line for selectively providing signals from one of the first analog output terminal or the digital-test input line to the digital input terminal. The first analog multiplexer and the first digital multiplexer isolate the analog and digital circuits from each other, and allow test signals to be substituted for the normal analog or digital information communicated between the circuits. The second analog multiplexer and the second digital multiplexer allow isolation and observation of the characteristics of the respective analog and digital circuits.

To reduce the number of package pins required to implement the architecture, while simultaneously allowing observability of circuit nodes, the analog block includes a second analog multiplexer coupled to the first and second analog output terminals and to the analog input terminal, for selectively providing signals from one of these terminals to an external analog output pin. Similarly, a second digital multiplexer is coupled to the first and second digital output terminals and to the digital input terminal for selectively providing signals from one of these terminals to an external digital output pin.

To enable the circuit designer to determine the number of additional package pins required to obtain a desired degree of completeness in testing the analog circuit, analog test tables may be constructed to guide the user in determining what nodes to pin-out for testability purposes.

These and other features and advantages of the invention will become apparent to those skilled in the art upon reading the following detailed description of the invention, which should be taken in conjunction with the accompanying drawings.

DETAILED DESCRIPTION OF THE PREFERRED EMBODIMENTS

Figure 1:
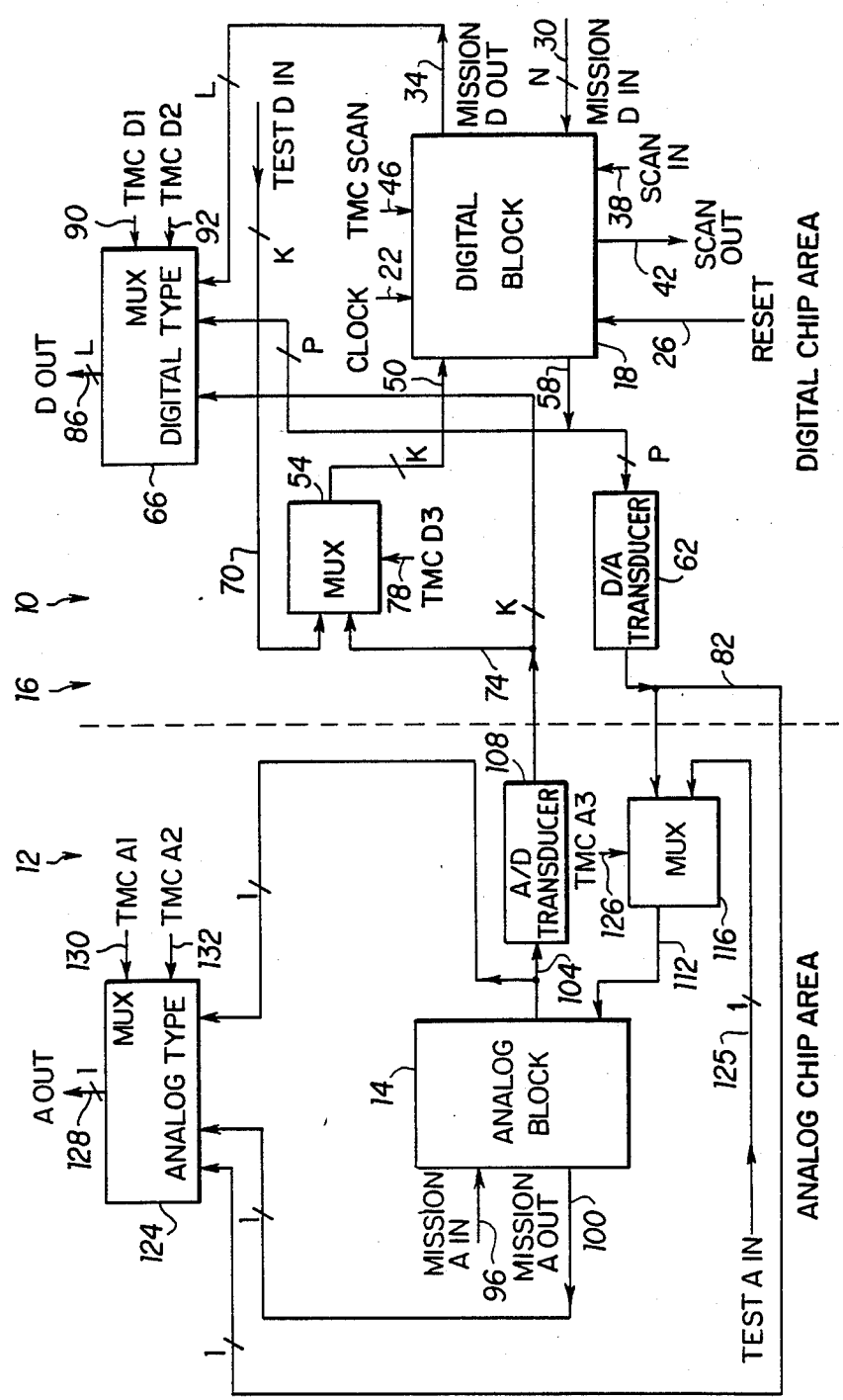
FIG. 1 is a block diagram of an architecture and device for testing mixed analog and digital VLSI circuits according to the present invention.

FIG. 1 is a block diagram of a mixed analog/digital ASIC chip 10 according to the present invention. ASIC chip 10 includes an analog chip area 12 having a conceptual analog block 14, and a digital chip area 16 having a conceptual digital block 18. Analog block 14 comprises one or more analog circuit elements, depending on the application requirements. For example, circuits within analog block 14 may comprise op amps, comparators, analog switches, precision voltage references, A/D converters, D/A converters, resistors, and other analog circuit elements. Digital block 18 comprises one or more digital logic elements (e.g., NOR gates, flip flops, etc.), which may be interconnected for forming combinational and/or sequential logic arrays.

Digital block 18 typically includes an input terminal for receiving clock pulses over a clock line 22 for controlling the synchronous operation of digital block 18; an input terminal for receiving reset signals over a reset line 26 for setting the logic elements within digital block 18 to a predetermined state: an N-bit input terminal for receiving mission input signals over N-bit mission input lines 30; and an L-bit output terminal for communicating mission output signals over L-bit mission output lines 34. L and N are integers greater than zero. A mission signal is one which is applied or observed when performing normal application functions only. Therefore, mission input lines 30 communicate normal application input signals to digital block 18, whereas mission output lines 34 communicate normal application output signals from digital block 18.

Digital block 18 further includes an input terminal for receiving scan input signals from a line 38, an output terminal for communicating scan output signals over a line 42, and an input terminal for receiving scan test mode control signals over a scan test mode control line 46. Signals on scan test mode control line 46 selectively place digital block 18 in a test mode. When digital block 18 is set in a test mode, scan input line 38 provides serial test input signals to digital block 18, and scan output line 42 provides the test results from digital block 18. Components coupled to scan input line 38 and scan output line 42 may take a number of configurations and may, for example, be constructed in accordance with test schemes described by E. B. Eichelberger and T. W. Williams in "A Logic Design Structure For LSI Testability," DAC Proceedings, 1977, and H. Ando in "Testing VLSI With Random Access Scan," COMPCON Spring Proceedings, 1980, both of which are incorporated herein by reference.

Digital block 18 also includes a K-bit input terminal for receiving signals over a K-bit line 50 from a digital input multiplexer 54, and a P-bit output terminal for communicating signals over a P-bit digital-analog feed line 58 to a D/A transducer 62 and to a digital output multiplexer 66. K and P are integers greater than zero. Digital input multiplexer 54 receives signals from a K-bit digital test input line 70 and from a K-bit A/D output line 74. Typically, each bit on digital test input line 70 corresponds to a bit on A/D output line 74, and digital input multiplexer 54 selectively provides digital signals from one of each pair of lines to digital block 18 in response to signals received from a test mode control line 78. Digital input multiplexer 54 allows digital block 18 to be isolated from analog block 14 by allowing the substitution of digital test inputs in place of the normal analog-derived inputs. Digital output multiplexer 66 receives signals from A/D transducer output line 74, digital-analog feed line 58, or mission output line 34, and communicates signals from one of these lines to an L-Bit external digital output pin or line 86 in response to signals received over test mode control lines 90 and 92.

Analog block 14 receives mission input signals on a mission input line(s) 96 and provides mission output signals on a mission output line(s) 100. Analog block 14 includes an input terminal for receiving signals over a line 112 from an analog input multiplexer 116 and an output terminal for communicating signals over an analog-digital feed line 104 to an A/D transducer 108 and to an analog output multiplexer 124. Analog input multiplexer 116 receives signals from an analog test input line 125 and from D/A output line 82. As with digital input multiplexer 54 in digital chip area 16, analog input multiplexer 116 selectively provides analog signals from one of these lines to analog block 14 in response to signals received from a test mode control line 126. Analog input multiplexer 116 allows analog block 14 to be isolated from digital block 18 by allowing the substitution of analog test inputs in place of the normal digitally-derived inputs. Analog output multiplexer 124 receives signals from D/A transducer output line 82, analog-digital feed line 104, and mission output lines 100, and communicates the signals from one of these lines to an external analog output pin or line 128 in response to signals received over test mode control lines 130 and 132.

In operation, analog mission input signals are supplied to analog block 14 through analog mission input lines 96, and digital mission input signals are provided to digital block 18 through digital mission input lines 30. Analog-derived digital signals are provided to digital chip area 16 through A/D transducer 108, and digitally derived analog signals are provided to analog chip area 12 through D/A transducer 62. Analog mission output signals from analog mission output lines 100 are communicated to analog output line 128 through multiplexer 124. Similarly, digital mission output signals from digital mission output lines 34 are communicated to digital output line 86 through multiplexer 66.

When it is desired to test analog block 14, analog block 14 may be isolated from digital block 18 by multiplexer 116, and the digitally derived signals normally received over D/A transducer output line 82 may be substituted with analog test input signals applied to analog test input line 125. Analog output multiplexer 124 then may be operated to observe analog circuit characteristics by selectively communicating to analog output line 128 the signals from D/A transducer output line 82, analog-digital feed line 104, and/or analog mission output lines 100.

When it is desired to test digital block 18, signals are provided on test mode control input line 46 for placing digital block 18 in a test mode, and scan test input signals are provided on scan input line 38. If desired, digital block 18 may be isolated from analog chip block 14 by digital input multiplexer 54, and the normal analog signals received from A/D transducer output line 74 may be substituted with digital test input signals applied to digital test input line 70. Digital output multiplexer 66 then may be operated to observe digital circuit characteristics by selectively communicating to digital output line 86 the signals from A/D transducer output line 74, digital-analog feed line 58, or mission output lines 34. Additionally, the test results of circuitry within digital block 18 may be obtained by clocking out the scan path signals on scan output line 42.

Figure 2:
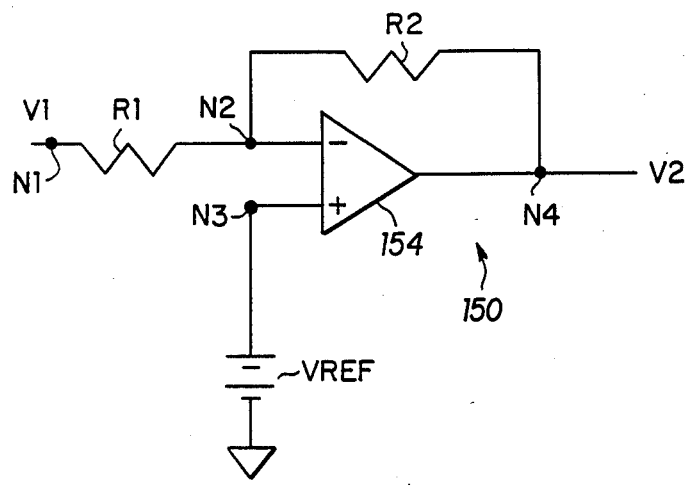
FIG. 2 is a diagram of a circuit configuration to be used with an analog test table according to the present invention.

To facilitate controllability, observability, and completeness in testing, a list of basic circuit configurations (including feedback and gainsetting elements) for different types of commonly encountered analog devices should be compiled. The list should cover all commonly used circuit configurations employing these devices. Such a configuration is illustrated in FIG. 2, which depicts a standard inverting amplifier 150. Amplifier 150 comprises an operational amplifier 154 having a non-inverting input terminal coupled to a node N3, which, in turn, is coupled to a reference voltage source VREF. Op amp 154 has an inverting input terminal coupled to a node N2 between a resistor R1 and a resistor R2. The other terminal of resistor R1 is coupled to a node N1, and the other terminal of resistor R2 is coupled to a node N4. Node N4 is coupled to the output terminal of op amp 154. The parameters chosen for testing each configuration must constitute a necessary and sufficient set to ensure that manufacturing defects are detected. From the compiled list, each device should be examined with respect to what minimum set of parameters need to be tested and what nodes need to be brought out to the packing pins. The known parameters to be tested for inverting amplifier 150 are provided in Table 1.

TABLE 1

| Parameters To Be Tested | Test Condition |
|---|---|
| 1. Closed-loop voltage gain | |
| 2. VOS @ VREF | |
| 3. VOH | RL = 10K Ohm |
| 4. a. VOL | RL = 10K Ohm to GRD |
| b. VOL | RL = 10K Ohm to VDD |
| 5. Slew Rate | |
| 6. VREF | |

To enable the parameters in Table 1 to be tested, it is necessary to have access to nodes N1, N3, and N4. These nodes may be accessed either by directly bringing the node out to a package pin or by accessing the node via analog test input line 125, analog output multiplexer 124, or digital output multiplexer 66. Analog multiplexer 124 and digital multiplexer 66 minimize the number of pins required to implement this architecture. Of course, the actual parameters to be tested may be determined by the circuit designer. For example, if it is desirable not to test VREF, then node N3 need not be accessed.

While the above is a complete description of a preferred embodiment of the present invention, various modifications may be employed. For example, more than one A/D transducer 108, multiplexer 116, multiplexer 54, or D/A transducer 62 may be provided, depending on the number of nodes accessed within analog block 14. Consequently, the scope of the invention should not be limited except as properly described in the claims.

What is claimed is:

1. A mixed analog/digital ASIC chip
   an analog circuit, including:
      an analog input terminal for receiving analog information derived from a digital circuit; and
      a first analog output terminal for providing analog information to the digital circuit;
   a digital circuit, including:
      a digital input terminal for receiving digital information derived from the analog circuit; and
      a first digital output terminal for providing digital information to the analog circuit; and
   a first analog multiplexer, coupled to the first digital output terminal, to the analog input terminal, and to an analog test signal source, for selectively providing signals from one of the first digital output terminal or the analog test signal source to the analog input terminal.

2. The circuit according to claim 1 further comprising:
   a second analog output terminal for providing an output signal from the analog circuit; and
   a second analog multiplexer, coupled to the first analog output terminal, to the second analog output terminal, and to the analog input terminal, for selectively providing signals from one of the first analog output terminal, the second analog output terminal, or the analog input terminal to an external analog output terminal.

3. The circuit according to claim 2 wherein the first digital output terminal emits digital signals, and further comprising:
   a digital-to-analog transducer, coupled to the first analog multiplexer and to the first digital output terminal, for converting the digital signals emitted from the first digital output terminal into analog signals for use by the analog circuit.

4. A mixed analog/digital ASIC chip comprising:
   an analog input terminal for receiving analog information derived from a digital circuit; and
   a first analog output terminal for providing analog information to the digital circuit;
   a digital circuit, including:
      a digital input terminal for receiving digital information derived from the analog circuit; and
      a first digital output terminal for providing digital information to the analog circuit; and
   a first digital multiplexer, coupled to the first analog output terminal, to the digital input terminal, and to a digital test signal source, for selectively providing signals from one of the first analog output terminal or the digital test signal source to the digital input terminal.

5. The circuit according to claim 4 further comprising:
a second digital output terminal for providing an output signal from the digital circuit; and
a second digital multiplexer, coupled to the first digital output terminal, to the second digital output terminal, and to the digital input terminal, for selectively providing signals from one of the first digital output terminal, the second digital output terminal, or the digital input terminal to an external digital output terminal.

6. The circuit according to claim 5 wherein the first analog output terminal emits analog signals, and further comprising:
an analog-to-digital transducer, coupled to the first digital multiplexer and to the first analog output terminal, for converting the analog signals emitted from the first analog output terminal into digital signals for use by the digital circuit.

7. The circuit according to claim 4 further comprising:
a first analog multiplexer, coupled to the first digital output terminal, to the analog input terminal, and to an analog test signal source, for selectively providing signals from one of the first digital output terminal or the analog test signal source to the analog input terminal.

8. The circuit according to claim 7 further comprising:
a second digital output terminal for providing an output signal from the digital circuit; and
a second digital multiplexer, coupled to the first digital output terminal, to the second digital output terminal, and to the digital input terminal, for selectively providing signals from one of the first digital output terminal, the second digital output terminal, or the digital input terminal to an external digital output terminal.

9. The circuit according to claim 8 wherein the first digital output terminal emits digital signals, and further comprising:
a digital-to-analog transducer, coupled to the first analog multiplexer and to the first digital output terminal, for converting the digital signals emitted from the second digital output terminal into analog signals for use by the analog circuit.

10. The circuit according to claim 9 further comprising:
a second analog output terminal for providing an output signal from the analog circuit; and
a second analog multiplexer, coupled to the first analog output terminal, to the second digital output terminal, and to the analog input terminal, for selectively providing signals from one of the first analog output terminal, the second analog output terminal, or the analog input terminal to an external analog output terminal.

11. The circuit according to claim 10 wherein the first analog output terminal emits analog signals, and further comprising:
an analog-to-digital transducer, coupled to the first digital multiplexer and to the first analog output terminal, for converting the analog signals emitted from the first analog output terminal into digital signals for use by the digital circuit.

12. A method of constructing a testable integrated circuit comprising the steps of:
determining parameters which may be tested for a basic circuit element;
determining which nodes of the basic circuit element must be accessed to test a selected parameter;
selecting parameters to be tested for the basic circuit element;
embedding the basic circuit element internally within an integrated circuit; and
providing external access to an internally embedded node of the basic circuit element which must be accessed to test the selected parameters.

13. The method according to claim 12 wherein the parameter determining step comprises the step of determining parameters which may be tested for a basic analog circuit element.

14. The method according to claim 13 wherein the embedding step comprises the step of embedding the basic circuit element internally within a mixed analog and digital integrated circuit.

15. The method according to claim 14 further comprising the steps of separating the analog components of the integrated circuit into an analog block; and
separating the digital components of the integrated circuit into a digital block.

16. The method according to claim 15 wherein the access providing step comprises the step of providing, through a multiplexer, external access to an internally embedded node of the basic circuit element which must be accessed to test a selected parameter.

17. A method of constructing a testable integrated circuit comprising the steps of:
determining parameters which may be tested for a basic analog circuit element;
determining which nodes of the basic circuit element must be accessed to test a selected parameter;
selecting parameters to be tested for the basic circuit element;
incorporating the basic circuit element into a mixed analog and digital integrated circuit;
separating the analog components of the integrated circuit into an analog block;
separating the digital components of the integrated circuit into a digital block;
communicating an analog signal from the analog block to the digital block through an analog-to-digital output line; and
providing, through a multiplexer, external access to nodes which must be accessed to test a selected parameter.

18. The method according to claim 17 further comprising the step of providing external access to signals being communicated over the analog-to-digital output line.

19. The method according to claim 17 further comprising the step of providing, through a multiplexer, external access to the signals being communicated over the analog-to-digital output line.

20. The method according to claim 16 further comprising the step of communicating digital signals from the digital block to the analog block through a digital-to-analog output line.

21. The method according to claim 20 further comprising the step of providing external access to signals being communicated over the digital-to-analog output line.

22. The method according to claim 20 further comprising the step of providing, through a multiplexer, external access to the signals being communicated over the digital-to-analog output line.

23. The method according to claim 17 wherein the incorporating step further comprises the step of embedding the basic circuit element internally within the integrated circuit, and wherein the access providing step further comprises the step of providing, through a multiplexer, external access to an internally embedded node of the basic circuit element which must be accessed to test a selected parameter.

* * * * *